United States Patent
Liu et al.

(10) Patent No.: US 10,096,656 B1
(45) Date of Patent: Oct. 9, 2018

(54) MANUFACTURING METHOD FOR COMPLEMENTARY TFT DEVICE AND MANUFACTURING METHOD FOR OLED DISPLAY PANEL

(71) Applicant: Wuhan China Star Optoelectronics Technology Co., Ltd., Wuhan (CN)

(72) Inventors: Zhe Liu, Wuhan (CN); Xuanyun Wang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/541,471

(22) PCT Filed: May 16, 2017

(86) PCT No.: PCT/CN2017/084606
§ 371 (c)(1),
(2) Date: Jul. 3, 2017

(51) Int. Cl.
*H01L 21/00* (2006.01)
*H01L 27/28* (2006.01)
*H01L 27/12* (2006.01)
*H01L 27/32* (2006.01)
*H01L 51/56* (2006.01)

(52) U.S. Cl.
CPC ......... *H01L 27/286* (2013.01); *H01L 27/127* (2013.01); *H01L 27/1225* (2013.01); *H01L 27/283* (2013.01); *H01L 27/3246* (2013.01); *H01L 27/3262* (2013.01);
(Continued)

(58) Field of Classification Search
CPC . H01L 27/286; H01L 27/1225; H01L 27/283; H01L 27/127; H01L 27/3274; H01L 27/3246; H01L 27/3262; H01L 51/56
See application file for complete search history.

(56) References Cited

U.S. PATENT DOCUMENTS 9,287,329 B1 * 3/2016 Lee .................. H01L 51/0097
9,356,087 B1 * 5/2016 Lee .................. H01L 27/3276
(Continued)

FOREIGN PATENT DOCUMENTS

| CN | 105609502 A | 5/2016 |
| CN | 105742308 A | 7/2016 |

(Continued)

*Primary Examiner* — Richard Booth
(74) *Attorney, Agent, or Firm* — Leong C. Lei

(57) ABSTRACT

The invention provides a manufacturing method for complementary TFT device. The manufacturing method for complementary TFT device uses a solution method to continuously form a metal oxide semiconductor TFT and an organic semiconductor TFT; the metal oxide semiconductor TFT and the organic semiconductor TFT are electrically connected, and one of the metal oxide semiconductor TFT and the organic semiconductor TFT is an N-type channel TFT, and the other is a P-type channel TFT. The method can reduce the use of vacuum apparatus and high temperature apparatus, and explore the advantages of the solution method to realize large area and low-cost to reduce production costs and increase product competitiveness. The invention also provides a manufacturing method for OLED display panel, able to reduce production cost and increase product competitiveness.

12 Claims, 11 Drawing Sheets

(52) U.S. Cl.
CPC .......... *H01L 27/3274* (2013.01); *H01L 51/56* (2013.01); *H01L 2227/323* (2013.01)

(56) References Cited

U.S. PATENT DOCUMENTS

| | | |
|---|---|---|
| 2009/0001361 A1 | 1/2009 | Shiba et al. |
| 2016/0181346 A1* | 6/2016 | Kwon ................. H01L 27/3276 257/40 |

FOREIGN PATENT DOCUMENTS

| | | |
|---|---|---|
| CN | 105742309 A | 7/2016 |
| CN | 105977165 A | 9/2016 |
| CN | 106328592 A | 1/2017 |

* cited by examiner

Step 1: providing a substrate, forming a first gate, a first electrode and a second electrode on the substrate, distributed with gaps in-between;

Step 2: forming, in subsequent order, a stack of a second active layer, a second gate dielectric layer, and a second gate at a gap area between the first electrode and the second electrode, and a portion of the gap area near the first electrode and the second electrode;

Step 3: covering the substrate, the first gate, the first electrode, the second electrode, the second gate with a first gate dielectric layer, patternizing the first gate dielectric layer to form a via above the first electrode to expose a portion of the first electrode;

Step 4: forming a first active layer on the first gate dielectric layer above the first gate;

Step 5: forming a third electrode and a fourth electrode contacting respectively with two ends of the first active layer on the first gate dielectric layer, the fourth electrode contacting the first electrode through the via;
wherein one of the first active layer and the second active layer being an N-type channel active layer and the other being a P-type channel active layer; one of the first active layer and the second active layer being a metal oxide semiconductor active layer and the other being an organic semiconductor active layer; the first active layer and the second active layer being fabricated by a solution method.

Fig. 12

Step 1' : providing a substrate, forming a first gate, a first electrode, a second electrode, and a capacitor lower electrode plate on the substrate, distributed with gaps in-between;

Step 2' : forming, in subsequent order, a stack of a second active layer, a second gate dielectric layer, and a second gate at a gap area between the first electrode and the second electrode, and a portion of the gap area near the first electrode and the second electrode;

Step 3' : covering the substrate, the first gate, the first electrode, the second electrode, the second gate with a first gate dielectric layer, patternizing the first gate dielectric layer to respectively form a first via above the first electrode and a second via above the second gate, the first via and the second via respectively exposing a portion of the first electrode and a portion of the second gate;

Step 4' : forming a first active layer on the first gate dielectric layer above the first gate;

Step 5' : on the first gate dielectric layer, forming a third electrode and a fourth electrode contacting respectively with two ends of the first active layer, and a capacitor upper electrode plate above the capacitor lower electrode plate, the fourth electrode contacting the first electrode through the first via, and the capacitor upper electrode plate contacting the second gate through the second via;

Step 6' : forming a planarization layer, on the third electrode, the fourth electrode, the capacitor upper electrode plate, the first active layer, and the first gate dielectric layer; forming on the planarization layer, in subsequent order of, a pixel electrode, a pixel definition layer and an organic light-emitting layer;
wherein one of the first active layer and the second active layer being an N-type channel active layer and the other being a P-type channel active layer; one of the first active layer and the second active layer being a metal oxide semiconductor active layer and the other being an organic semiconductor active layer;
the first active layer and the second active layer being fabricated by a solution method.

Fig. 13

MANUFACTURING METHOD FOR COMPLEMENTARY TFT DEVICE AND MANUFACTURING METHOD FOR OLED DISPLAY PANEL

BACKGROUND OF THE INVENTION

1. Field of the Invention

The present invention relates to the field of display, and in particular to a manufacturing method for complementary thin film transistor (TFT) device and manufacturing method for organic light-emitting diode (OLED) display panel.

2. The Related Arts

The flat display device, with the advantages of thin body, saving power, no radiation and many others, has been widely used. The known flat display device mainly comprises liquid crystal display (LCD) and organic light emitting diode (OLED) display device.

The organic light-emitting diode (OLED) panel has the characteristics of active light-emitting, without backlight source, high contrast, thinness, wide viewing angle, suitable for flexible panel, wide operation temperature range, simple structure and simple manufacturing process, and is regarded as the most promising display technology.

The OLED display device generally comprises: a substrate, an anode provided on the substrate, an organic light emitting layer provided on the anode, an electron transport layer provided on the organic light-emitting layer, and a cathode provided on the electron transport layer. In operation, the holes from the anode and the electrons from the cathode are emitted to the organic light-emitting layer, and the combination of electrons and holes generates an excited electron-hole pair, and the excited electron-hole pairs are converted from the excited state to the ground state to realize light.

The solution method for manufacturing electronic film, electronic devices and electronic circuits has the advantages of simple process, low cost and ability to realize large are. In recent years, the research on the process of manufacturing electronic film by solution method and solution-based electronic devices make great progress, and the performance in many aspects can be compared to, or even exceeds, the electronic film and corresponding electronic devices manufactured by the traditional vacuum process.

The complementary thin film transistor (TFT) device is composed of P-type channel TFT and N-type channel TFT. The complementary TFT device is a circuit commonly used in flat panel display. The material for TFT active layer in the complementary TFT device is usually a metal oxide semiconductor, and the production process is usually complex and needs to use a large number of vacuum equipment and high temperature equipment, resulting in high production cost.

The organic thin film transistor (OTFT) is a TFT device using an organic semiconductor material as active layer. The solution method is a common method for preparing organic semiconductor TFT, which has the advantages of simple process, low cost and capability to realize large area.

SUMMARY OF THE INVENTION

The object of the present invention is to provide a manufacturing method for complementary TFT device, able to reduce production cost and increase competitiveness.

Another object of the present invention is to provide manufacturing method for OLED display panel, able to reduce production cost and increase competitiveness.

To achieve the above object, the present invention provides a manufacturing method for complementary thin film transistor (TFT) device, comprising the steps of:

Step 1: providing a substrate, forming a first gate, a first electrode and a second electrode on the substrate, distributed with gaps in-between;

Step 2: forming, in subsequent order, a stack of a second active layer, a second gate dielectric layer, and a second gate at a gap area between the first electrode and the second electrode, and a portion of the gap area near the first electrode and the second electrode;

Step 3: covering the substrate, the first gate, the first electrode, the second electrode, the second gate with a first gate dielectric layer, patternizing the first gate dielectric layer to form a via above the first electrode to expose a portion of the first electrode;

Step 4: forming a first active layer on the first gate dielectric layer above the first gate;

Step 5: forming a third electrode and a fourth electrode contacting respectively with two ends of the first active layer on the first gate dielectric layer, the fourth electrode contacting the first electrode through the via;

wherein one of the first active layer and the second active layer being an N-type channel active layer and the other being a P-type channel active layer; one of the first active layer and the second active layer being a metal oxide semiconductor active layer and the other being an organic semiconductor active layer;

manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

manufacturing process for the organic semiconductor active layer comprising: disposing an organic semiconductor solution, baking the organic semiconductor solution to obtain an organic semiconductor thin film, and patternizing the organic semiconductor film to obtain an organic semiconductor active layer.

According to a preferred embodiment of the present invention, the first active layer is an N-type channel metal oxide semiconductor active layer, and the second active layer is a P-type channel organic semiconductor active layer.

According to a preferred embodiment of the present invention, Step 2 specifically comprises: using a solution coating process and a baking process sequentially to obtain a P-type organic semiconductor thin film covering the substrate, the first gate, the first electrode, and the second electrode, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate, using the second gate as a mask to perform dry etching simultaneously on the P-type organic semiconductor thin film and the organic dielectric material thin film to obtain the second active layer and the second gate dielectric layer.

According to a preferred embodiment of the present invention, Step 4 specifically comprises: coating an N-type metal oxide semiconductor precursor solution on the first gate dielectric layer to form an N-type metal oxide semiconductor precursor thin film, annealing the N-type metal oxide semiconductor precursor thin film to obtain an N-type metal oxide semiconductor thin film, patterning the N-type metal oxide semiconductor thin film to obtain the first active layer.

According to a preferred embodiment of the present invention, the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution.

The present invention also provides a manufacturing method for organic light-emitting diode (OLED) display panel, comprising the steps of:

Step 1': providing a substrate, forming a first gate, a first electrode, a second electrode, and a capacitor lower electrode plate on the substrate, distributed with gaps in-between;

Step 2': forming, in subsequent order, a stack of a second active layer, a second gate dielectric layer, and a second gate at a gap area between the first electrode and the second electrode, and a portion of the gap area near the first electrode and the second electrode;

Step 3': covering the substrate, the first gate, the first electrode, the second electrode, the second gate with a first gate dielectric layer, patternizing the first gate dielectric layer to respectively form a first via above the first electrode and a second via above the second gate, the first via and the second via respectively exposing a portion of the first electrode and a portion of the second gate;

Step 4': forming a first active layer on the first gate dielectric layer above the first gate;

Step 5': on the first gate dielectric layer, forming a third electrode and a fourth electrode contacting respectively with two ends of the first active layer, and a capacitor upper electrode plate above the capacitor lower electrode plate, the fourth electrode contacting the first electrode through the first via, and the capacitor upper electrode plate contacting the second gate through the second via;

Step 6': forming a planarization layer, on the third electrode, the fourth electrode, the capacitor upper electrode plate, the first active layer, and the first gate dielectric layer; forming on the planarization layer, in subsequent order of, a pixel electrode, a pixel definition layer and an organic light-emitting layer;

wherein one of the first active layer and the second active layer being an N-type channel active layer and the other being a P-type channel active layer; one of the first active layer and the second active layer being a metal oxide semiconductor active layer and the other being an organic semiconductor active layer;

manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

manufacturing process for the organic semiconductor active layer comprising: disposing an organic semiconductor solution, baking the organic semiconductor solution to obtain an organic semiconductor thin film, and patternizing the organic semiconductor film to obtain an organic semiconductor active layer.

According to a preferred embodiment of the present invention, the first active layer is an N-type channel metal oxide semiconductor active layer, and the second active layer is a P-type channel organic semiconductor active layer.

According to a preferred embodiment of the present invention, Step 2' specifically comprises: using a solution coating process and a baking process sequentially to obtain a P-type organic semiconductor thin film covering the substrate, the first gate, the first electrode, and the second electrode, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate, using the second gate as a mask to perform dry etching simultaneously on the P-type organic semiconductor thin film and the organic dielectric material thin film to obtain the second active layer and the second gate dielectric layer.

According to a preferred embodiment of the present invention, Step 4' specifically comprises: coating an N-type metal oxide semiconductor precursor solution on the first gate dielectric layer to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer.

According to a preferred embodiment of the present invention, the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution.

The present invention further provides a manufacturing method for complementary thin film transistor (TFT) device, comprising the steps of:

Step 1: providing a substrate, forming a first gate, a first electrode and a second electrode on the substrate, distributed with gaps in-between;

Step 2: forming, in subsequent order, a stack of a second active layer, a second gate dielectric layer, and a second gate at a gap area between the first electrode and the second electrode, and a portion of the gap area near the first electrode and the second electrode;

Step 3: covering the substrate, the first gate, the first electrode, the second electrode, the second gate with a first gate dielectric layer, patternizing the first gate dielectric layer to form a via above the first electrode to expose a portion of the first electrode;

Step 4: forming a first active layer on the first gate dielectric layer above the first gate;

Step 5: forming a third electrode and a fourth electrode contacting respectively with two ends of the first active layer on the first gate dielectric layer, the fourth electrode contacting the first electrode through the via;

wherein one of the first active layer and the second active layer being an N-type channel active layer and the other being a P-type channel active layer; one of the first active layer and the second active layer being a metal oxide semiconductor active layer and the other being an organic semiconductor active layer;

manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

manufacturing process for the organic semiconductor active layer comprising: disposing an organic semiconductor solution, baking the organic semiconductor solution to obtain an organic semiconductor thin film, and patternizing the organic semiconductor film to obtain an organic semiconductor active layer;

wherein the first active layer being an N-type channel metal oxide semiconductor active layer, and the second active layer being a P-type channel organic semiconductor active layer;

wherein Step 2 specifically comprising: using a solution coating process and a baking process sequentially to obtain a P-type organic semiconductor thin film covering the substrate, the first gate, the first electrode, and the second electrode, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate, using the second gate as a mask to perform dry etching simultaneously on the P-type organic semiconductor thin film and the organic dielectric material thin film to obtain the second active layer and the second gate dielectric layer;

wherein Step 4 specifically comprising: coating an N-type metal oxide semiconductor precursor solution on the first gate dielectric layer to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer.

Compared to the known techniques, the present invention provides the following advantages: the present invention provides a manufacturing method for complementary TFT device. The method uses a solution method to continuously form a metal oxide semiconductor TFT and an organic semiconductor TFT; the metal oxide semiconductor TFT and the organic semiconductor TFT are electrically connected, and one of the metal oxide semiconductor TFT and the organic semiconductor TFT is an N-type channel TFT, and the other is a P-type channel TFT. The method can reduce the use of vacuum apparatus and high temperature apparatus, and explore the advantages of the solution method to realize large area and low-cost to reduce production costs and increase product competitiveness. The present invention also provides a manufacturing method for OLED display panel, able to reduce production cost and increase product competitiveness.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings:

FIG. 12 is a schematic view showing the flowchart of the manufacturing method for complementary TFT device according to the present invention;

FIG. 13 is a schematic view showing the flowchart of the manufacturing method for OLED display panel according to the present invention.

DETAILED DESCRIPTION OF THE PREFERRED EMBODIMENTS

To further explain the technical means and effect of the present invention, the following refers to embodiments and drawings for detailed description.

Figure 1:
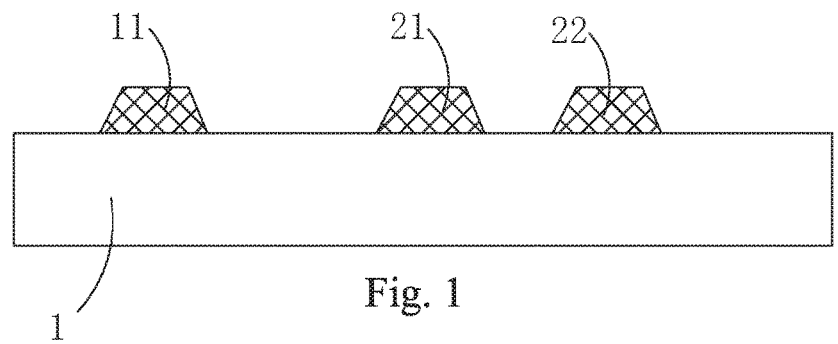
FIG. 1 is a schematic view showing Step 1 of the manufacturing method for complementary TFT device according to the present invention.

Refer to FIG. 12. The present invention provides a manufacturing method for complementary thin film transistor (TFT) device, comprising the steps of:

Step 1: as shown in FIG. 1, providing a substrate 1, forming a first gate 11, a first electrode 21 and a second electrode 22 on the substrate 1, distributed with gaps in-between.

Specifically, in Step 1, a metal thin film is formed on the substrate 1 by vapor deposition or sputtering, and then the metal thin film is patternized to obtain the first gate 11, the first electrode 21, and the second electrode 22; and the material for the metal thin film is preferably a combination of one or more of metals such as aluminum, molybdenum, and copper.

Figure 2:
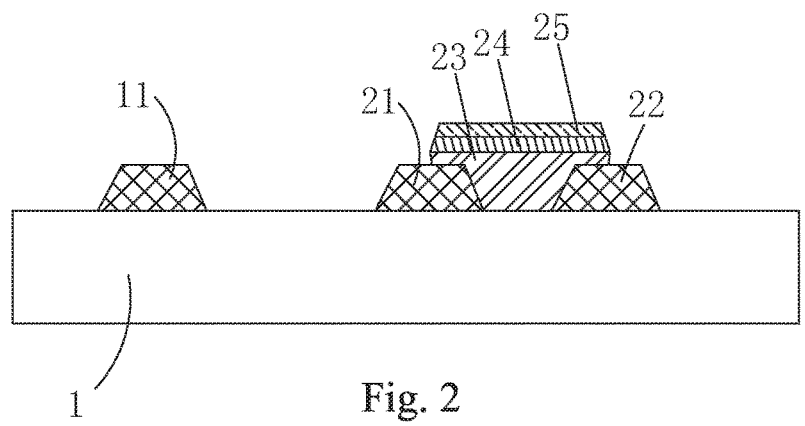
FIG. 2 is a schematic view showing Step 2 of the manufacturing method for complementary TFT device according to the present invention.

Step 2: as shown in FIG. 2, forming, in subsequent order, a stack of a second active layer 23, a second gate dielectric layer 24, and a second gate 25 at a gap area between the first electrode 21 and the second electrode 22, and a portion of the gap area near the first electrode 21 and the second electrode 22.

Figure 3:
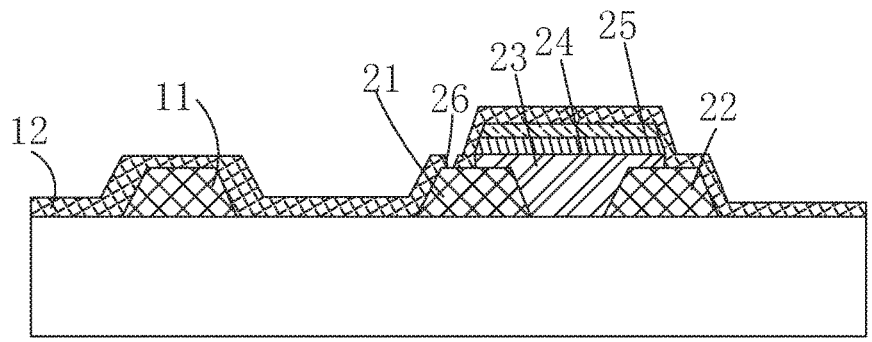
FIG. 3 is a schematic view showing Step 3 of the manufacturing method for complementary TFT device according to the present invention.

Step 3: as shown in FIG. 3, covering the substrate 1, the first gate 11, the first electrode 21, the second electrode 22, the second gate 25 with a first gate dielectric layer 12, patternizing the first gate dielectric layer 12 to form a via 26 above the first electrode 21 to expose a portion of the first electrode 21.

Figure 4:
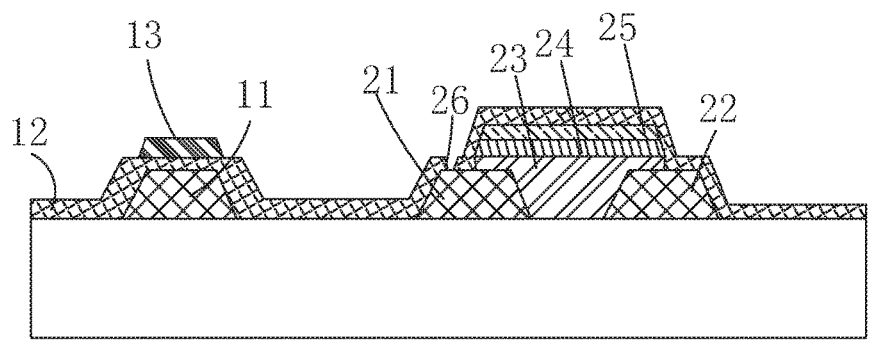
FIG. 4 is a schematic view showing Step 4 of the manufacturing method for complementary TFT device according to the present invention.

Step 4: as shown in FIG. 4, forming a first active layer 13 on the first gate dielectric layer 12 above the first gate 11.

Figure 5:
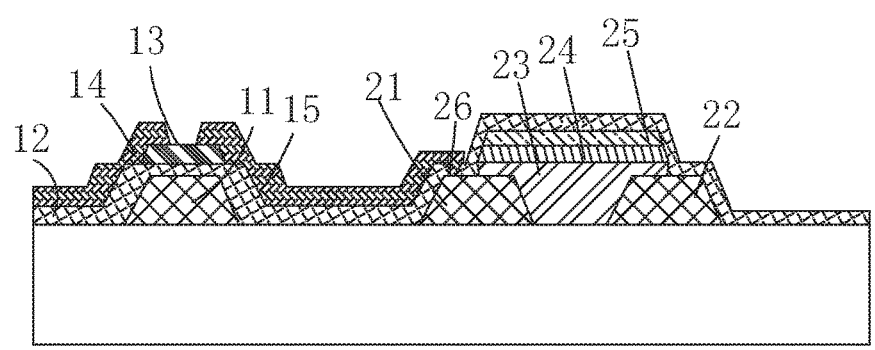
FIG. 5 is a schematic view showing Step 5 of the manufacturing method for complementary TFT device according to the present invention.

Step 5: as shown in FIG. 5, forming a third electrode 14 and a fourth electrode 15 contacting respectively with two ends of the first active layer 13 on the first gate dielectric layer 12, the fourth electrode 15 contacting the first electrode 21 through the via 26.

Specifically, the first gate 11, the first active layer 13, the third electrode 14, and the fourth electrode 15 form a first TFT. Optionally, the third electrode 14 and the fourth electrode 15 are the source and the drain of the first TFT, respectively. The second gate 25, the second active layer 23, the first electrode 21, and the second electrode 22 form a second TFT. Optionally, the first electrode 21 and the second electrode 22 are the source and the drain of the second TFT, respectively.

It should be noted that in the manufacturing method for complementary TFT provided by the present invention, one of the first active layer 13 and the second active layer 23 is an N-type channel active layer and the other is a P-type channel active layer; one of the first active layer 13 and the second active layer 23 is a metal oxide semiconductor active layer and the other is an organic semiconductor active layer.

It should also be noted that both the metal oxide semiconductor active layer and the organic semiconductor active layer are fabricated by a solution method. Specifically, the manufacturing process for the metal oxide semiconductor active layer comprises: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

The manufacturing process for the organic semiconductor active layer comprises: disposing an organic semiconductor solution, baking the organic semiconductor solution to obtain an organic semiconductor thin film, and patternizing the organic semiconductor film to obtain an organic semiconductor active layer.

In a preferred embodiment of the present invention, the first active layer 13 is an N-type channel metal oxide semiconductor active layer, and the second active layer 23 is a P-type channel organic semiconductor active layer.

Accordingly, Step 2 specifically comprises: using a solution coating process and a baking process sequentially to obtain a P-type organic semiconductor thin film covering the substrate 1, the first gate 11, the first electrode 21, and the second electrode 22, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate 25, using the second gate 25 as a mask to perform dry etching simultaneously on the P-type organic semiconductor thin film and the organic dielectric material thin film to obtain the second active layer 23 and the second gate dielectric layer 23. The organic semiconductor thin film and the organic dielectric material thin film are all fabricated by solution coating and baking processes.

Correspondingly, Step 4 specifically comprises: coating an N-type metal oxide semiconductor precursor solution on the first gate dielectric layer 12 to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer 13.

Moreover, the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution. More specifically, the metal halide may be indium trichloride (InCl3), and the metal oxide semiconductor may be a metal oxide semiconductor of a metal such as indium (In), gallium (Ga), zinc (Zn), or tin (Sn). The process of patternizing the N-type metal oxide semiconductor thin film comprises exposure, development, and etching.

It should be noted, in addition to, that the first active layer 13 is an N-type channel metal oxide semiconductor active layer, and the second active layer 23 is a P-type channel organic semiconductor active layer in the above embodiment, the present invention is also applicable to other embodiments, for example, the first active layer 13 is a P-type channel metal oxide semiconductor active layer, and the second active layer 23 is an N-type channel organic semiconductor active layer; the second active layer 23 is a P-type channel metal oxide semiconductor active layer, and the first active layer 13 is an N-type channel organic semiconductor active layer; the second active layer 23 is an N-type channel metal oxide semiconductor active layer, and the first active layer 13 is a P-type channel organic semiconductor active layer.

Figure 6:
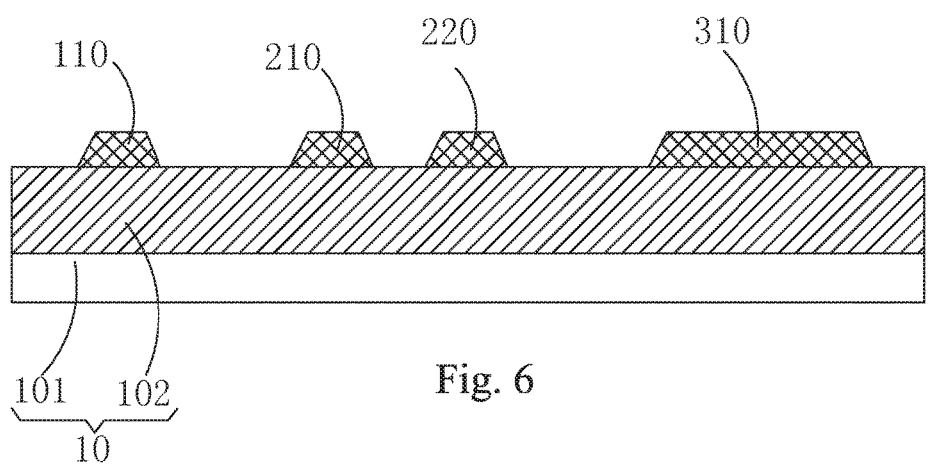
FIG. 6 is a schematic view showing Step 1' of the manufacturing method for OLED display panel according to the present invention.

Refer to FIG. 13. The present invention also provides a manufacturing method for organic light-emitting diode (OLED) display panel. The OLED display panel comprises the aforementioned complementary TFT devices. The manufacturing method for OLED display panel comprises the steps of:

Step 1': as shown in FIG. 6, providing a substrate 10, forming a first gate 110, a first electrode 210, a second electrode 220, and a capacitor lower electrode plate 230 on the substrate 1 distributed with gaps in-between.

Specifically, in Step 1', a metal thin film is formed on the substrate 10 by vapor deposition or sputtering, and then the metal thin film is patternized to obtain the first gate 110, the first electrode 210, the second electrode 22, and the capacitor lower electrode plate 230; and the material for the metal thin film is preferably a combination of one or more of metals such as aluminum, molybdenum, and copper.

Preferably, the OLED display panel is a flexible OLED display panel, and the substrate 10 comprises: a glass substrate 101, and a flexible substrate 102 disposed on the glass substrate 101.

Figure 7:
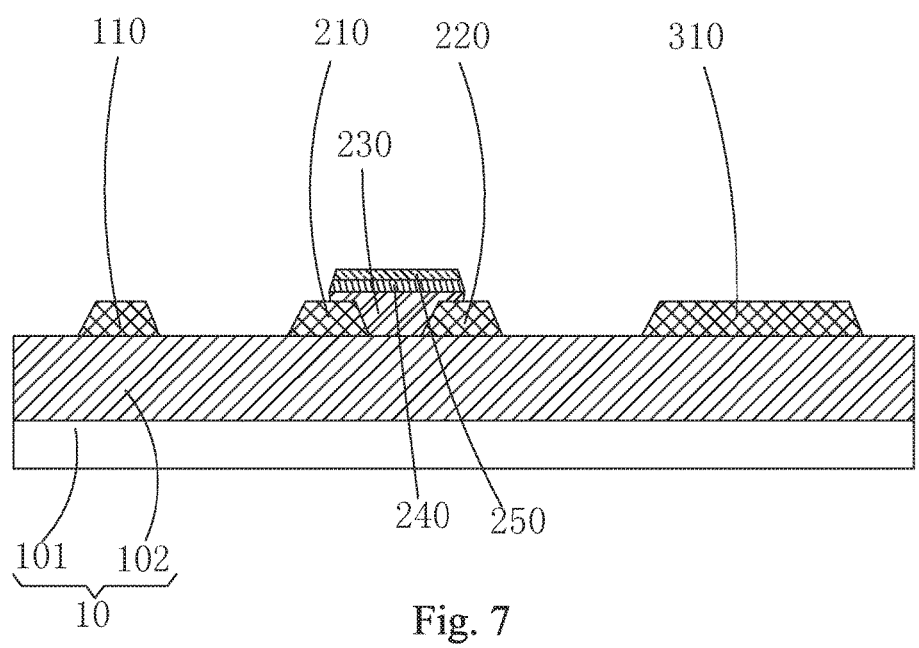
FIG. 7 is a schematic view showing Step 2' of the manufacturing method for OLED display panel according to the present invention.

Step 2': as shown in FIG. 7, forming, in subsequent order, a stack of a second active layer 230, a second gate dielectric layer 240, and a second gate 250 at a gap area between the first electrode 210 and the second electrode 220, and a portion of the gap area near the first electrode 210 and the second electrode 220.

Figure 8:
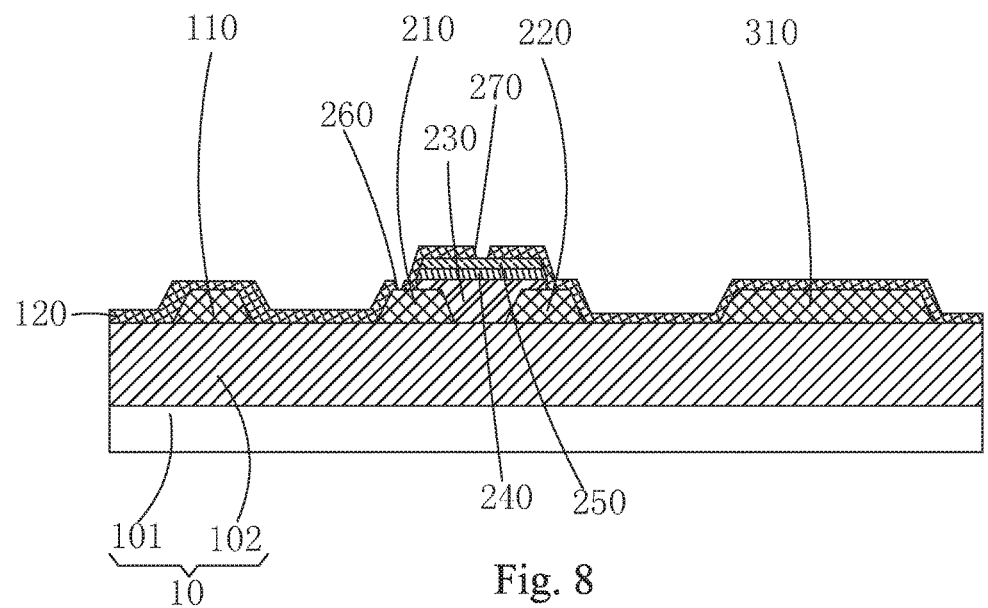
FIG. 8 is a schematic view showing Step 3' of the manufacturing method for OLED display panel according to the present invention.

Step 3': as shown in FIG. 8, covering the substrate 10, the first gate 110, the first electrode 210, the second electrode 220, the second gate 250 with a first gate dielectric layer 120, patternizing the first gate dielectric layer 120 to respectively form a first via 260 above the first electrode 210 and a second via 270 above the second gate 250, the first via 260 and the second via 270 respectively exposing a portion of the first electrode 210 and a portion of the second gate 250.

Figure 9:
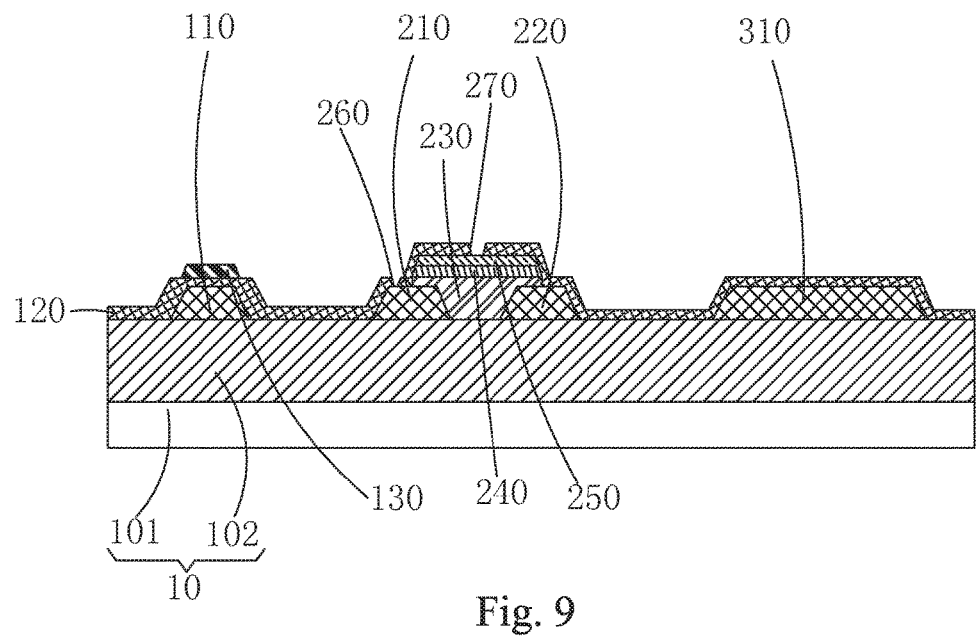
FIG. 9 is a schematic view showing Step 4' of the manufacturing method for OLED display panel according to the present invention.

Step 4': as shown in FIG. 9, forming a first active layer 130 on the first gate dielectric layer 120 above the first gate 110.

Figure 10:
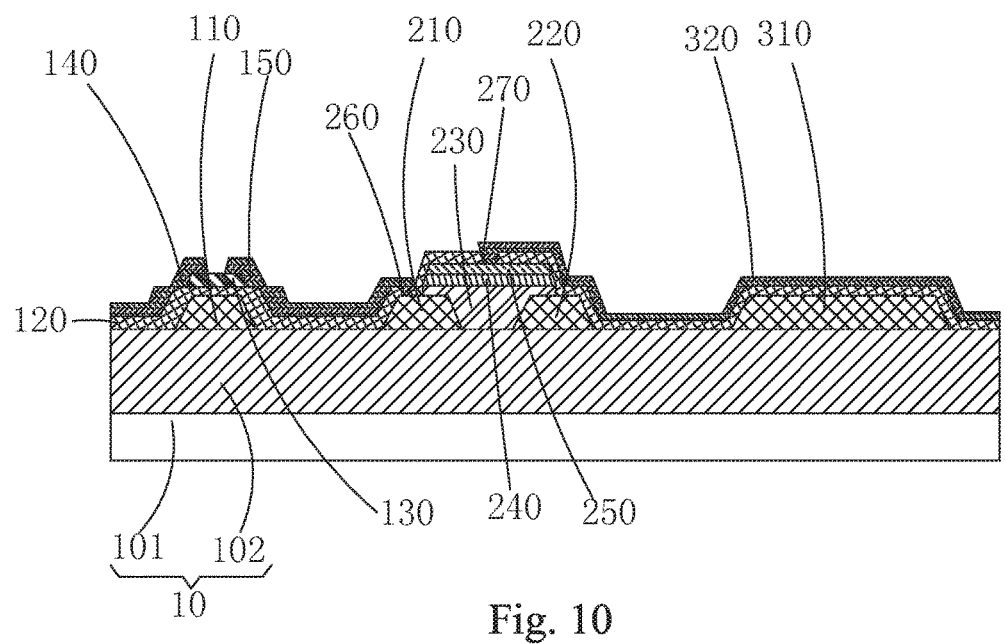
FIG. 10 is a schematic view showing Step 5' of the manufacturing method for OLED display panel according to the present invention.

Step 5': as shown in FIG. 10, on the first gate dielectric layer, 120 forming a third electrode 140 and a fourth electrode 150 contacting respectively with two ends of the first active layer 130, and a capacitor upper electrode plate 320 above the capacitor lower electrode plate 310, the fourth electrode 150 contacting the first electrode 210 through the first via 260, and the capacitor upper electrode plate 320 contacting the second gate 250 through the second via 270.

Figure 11:
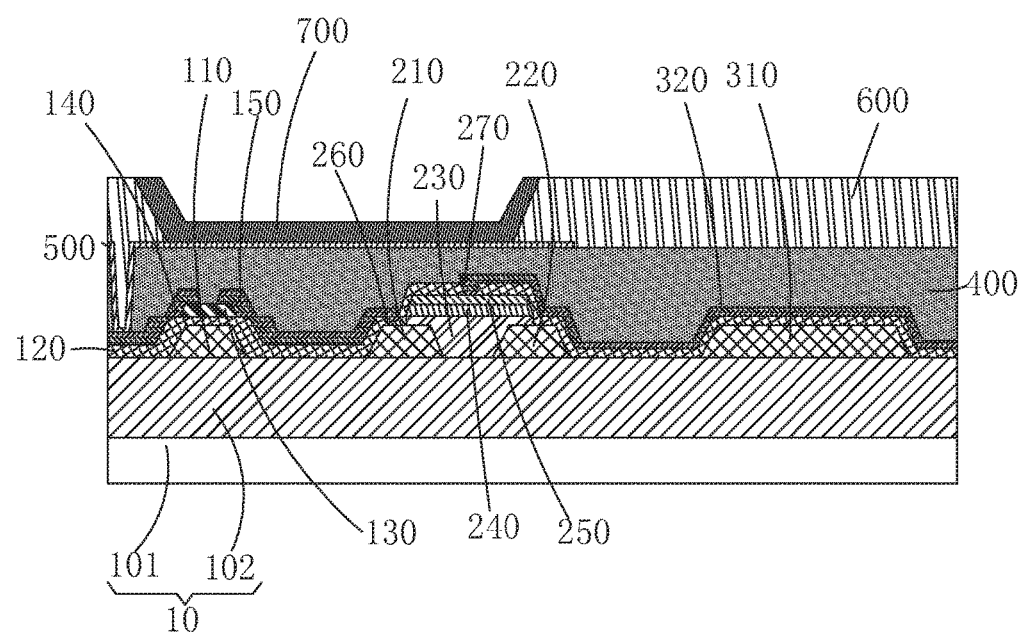
FIG. 11 is a schematic view showing Step 6' of the manufacturing method for OLED display panel according to the present invention.

Step 6': as shown in FIG. 11, forming a planarization layer 400, on the third electrode 140, the fourth electrode 150, the capacitor upper electrode plate 320, the first active layer 130, and the first gate dielectric layer 120; forming on the planarization layer 400, in subsequent order of, a pixel electrode 500, a pixel definition layer 600 and an organic light-emitting layer 700.

Specifically, the planarization layer 400 comprises: an inorganic passivation layer and an organic planarization layer provided in a stack, the pixel electrode 500 contacting with the third electrode 140 through a via penetrating the planarization layer 400. An area of the pixel defining layer 600 forms a groove corresponding to the pixel electrode 500 for exposing the pixel electrode 500. The organic light-emitting layer 700 is formed in the grove and contacts with the pixel electrode 500. An encapsulation layer (not shown) is also formed on the organic light emitting layer 700.

Specifically, the first gate 110, the first active layer 130, the third electrode 140, and the fourth electrode 150 form a first TFT. Optionally, the third electrode 140 and the fourth electrode 150 are the source and the drain of the first TFT, respectively. The second gate 250, the second active layer 230, the first electrode 210, and the second electrode 220 form a second TFT. Optionally, the first electrode 210 and the second electrode 220 are the source and the drain of the second TFT, respectively. The capacitor upper electrode plate 320 and the capacitor lower electrode plate 310 form a capacitor.

It should be noted that one of the first active layer 130 and the second active layer 230 is an N-type channel active layer and the other is a P-type channel active layer; one of the first active layer 130 and the second active layer 230 is a metal oxide semiconductor active layer and the other is an organic semiconductor active layer;

It should also be noted that both the metal oxide semiconductor active layer and the organic semiconductor active layer are fabricated by a solution method. Specifically, the manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

The manufacturing process for the organic semiconductor active layer comprising: disposing an organic semiconductor solution, baking the organic semiconductor solution to obtain an organic semiconductor thin film, and patternizing the organic semiconductor film to obtain an organic semiconductor active layer.

In a preferred embodiment of the present invention, the first active layer 130 is an N-type channel metal oxide semiconductor active layer, and the second active layer 230 is a P-type channel organic semiconductor active layer.

According to a preferred embodiment of the present invention, Step 2' specifically comprises: using a solution coating process and a baking process sequentially to obtain a P-type organic semiconductor thin film covering the substrate 10, the first gate 110, the first electrode 210, and the second electrode 220, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate 250, using the second gate 250 as a mask to perform dry etching simultaneously on the P-type organic semiconductor thin film and the organic dielectric material thin film to obtain the second active layer 230 and the second gate dielectric layer 240. The organic semiconductor thin film and the organic dielectric material thin film are all fabricated by solution coating and baking processes.

Correspondingly, Step 4' specifically comprises: coating an N-type metal oxide semiconductor precursor solution on the first gate dielectric layer 120 to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer 130.

Moreover, the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution. More specifically, the metal halide may be indium trichloride (InCl3), and the metal oxide semiconductor may be a metal oxide semiconductor of a metal such as indium (In), gallium (Ga), zinc (Zn), or tin (Sn). The process of patternizing the N-type metal oxide semiconductor thin film comprises exposure, development, and etching.

It should be noted, in addition to, that the first active layer 130 is an N-type channel metal oxide semiconductor active layer, and the second active layer 230 is a P-type channel organic semiconductor active layer in the above embodiment, the present invention is also applicable to other embodiments, for example, the first active layer 130 is a P-type channel metal oxide semiconductor active layer, and the second active layer 230 is an N-type channel organic semiconductor active layer; the second active layer 230 is a P-type channel metal oxide semiconductor active layer, and the first active layer 130 is an N-type channel organic semiconductor active layer; the second active layer 230 is an N-type channel metal oxide semiconductor active layer, and the first active layer 130 is a P-type channel organic semiconductor active layer.

In summary, the present invention provides a manufacturing method for complementary TFT device. The method uses a solution method to continuously form a metal oxide semiconductor TFT and an organic semiconductor TFT; the metal oxide semiconductor TFT and the organic semiconductor TFT are electrically connected, and one of the metal oxide semiconductor TFT and the organic semiconductor TFT is an N-type channel TFT, and the other is a P-type channel TFT. The method can reduce the use of vacuum apparatus and high temperature apparatus, and explore the advantages of the solution method to realize large area and low-cost to reduce production costs and increase product competitiveness. The present invention also provides a manufacturing method for OLED display panel, able to reduce production cost and increase product competitiveness.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method for complementary thin film transistor (TFT) device, comprising the steps of:
   Step 1: providing a substrate, forming a first gate, a first electrode and a second electrode on the substrate, distributed with gaps in-between;
   Step 2: forming, in subsequent order, a stack of a second active layer, a second gate dielectric layer, and a second gate at a gap area between the first electrode and the second electrode, and a portion of the gap area near the first electrode and the second electrode;
   Step 3: covering the substrate, the first gate, the first electrode, the second electrode, the second gate with a first gate dielectric layer, patterning the first gate dielectric layer to form a via above the first electrode to expose a portion of the first electrode;
   Step 4: forming a first active layer on the first gate dielectric layer above the first gate;
   Step 5: forming a third electrode and a fourth electrode contacting respectively with two ends of the first active layer on the first gate dielectric layer, the fourth electrode contacting the first electrode through the via;
   wherein one of the first active layer and the second active layer being an N-type channel active layer and the other being a P-type channel active layer; one of the first active layer and the second active layer being a metal oxide semiconductor active layer and the other being an organic semiconductor active layer;
   manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patterning the metal oxide semiconductor thin film to form a metal oxide semiconductor active layer;
   manufacturing process for the organic semiconductor active layer comprising: disposing an organic semiconductor solution, baking the organic semiconductor solution to obtain an organic semiconductor thin film, and patterning the organic semiconductor film to obtain an organic semiconductor active layer.

2. The manufacturing method for complementary TFT device as claimed in claim 1, wherein the first active layer is an N-type channel metal oxide semiconductor active layer, and the second active layer is a P-type channel organic semiconductor active layer.

3. The manufacturing method for complementary TFT device as claimed in claim 2, wherein Step 2 specifically comprises: using a solution coating process and a baking process sequentially to obtain a P-type organic semiconductor thin film covering the substrate, the first gate, the first electrode, and the second electrode, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate, using the second gate as a mask to perform dry etching simultaneously on the P-type organic semiconductor thin film and the organic dielectric material thin film to obtain the second active layer and the second gate dielectric layer.

4. The manufacturing method for complementary TFT device as claimed in claim 2, wherein Step 4 specifically comprises: coating an N-type metal oxide semiconductor precursor solution on the first gate dielectric layer to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer.

5. The manufacturing method for complementary TFT device as claimed in claim 4, wherein the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution.

6. A manufacturing method for organic light-emitting diode (OLED) display panel, comprising the steps of:
   Step 1': providing a substrate, forming a first gate, a first electrode, a second electrode, and a capacitor lower electrode plate on the substrate, distributed with gaps in-between;
   Step 2': forming, in subsequent order, a stack of a second active layer, a second gate dielectric layer, and a second gate at a gap area between the first electrode and the second electrode, and a portion of the gap area near the first electrode and the second electrode;
   Step 3': covering the substrate, the first gate, the first electrode, the second electrode, the second gate with a first gate dielectric layer, patternizing the first gate dielectric layer to respectively form a first via above the first electrode and a second via above the second gate, the first via and the second via respectively exposing a portion of the first electrode and a portion of the second gate;
   Step 4': forming a first active layer on the first gate dielectric layer above the first gate;
   Step 5': on the first gate dielectric layer, forming a third electrode and a fourth electrode contacting respectively with two ends of the first active layer, and a capacitor upper electrode plate above the capacitor lower electrode plate, the fourth electrode contacting the first electrode through the first via, and the capacitor upper electrode plate contacting the second gate through the second via;
   Step 6': forming a planarization layer, on the third electrode, the fourth electrode, the capacitor upper electrode plate, the first active layer, and the first gate dielectric layer; forming on the planarization layer, in subsequent order of, a pixel electrode, a pixel definition layer and an organic light-emitting layer;
   wherein one of the first active layer and the second active layer being an N-type channel active layer and the other being a P-type channel active layer; one of the first active layer and the second active layer being a metal oxide semiconductor active layer and the other being an organic semiconductor active layer;
   manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

manufacturing process for the organic semiconductor active layer comprising: disposing an organic semiconductor solution, baking the organic semiconductor solution to obtain an organic semiconductor thin film, and patternizing the organic semiconductor film to obtain an organic semiconductor active layer.

7. The manufacturing method for OLED display panel as claimed in claim 6, wherein the first active layer is an N-type channel metal oxide semiconductor active layer, and the second active layer is a P-type channel organic semiconductor active layer.

8. The manufacturing method for OLED display panel as claimed in claim 7, wherein Step 2' specifically comprises: using a solution coating process and a baking process sequentially to obtain a P-type organic semiconductor thin film covering the substrate, the first gate, the first electrode, and the second electrode, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate, using the second gate as a mask to perform dry etching simultaneously on the P-type organic semiconductor thin film and the organic dielectric material thin film to obtain the second active layer and the second gate dielectric layer.

9. The manufacturing method for OLED display panel as claimed in claim 7, wherein Step 4' specifically comprises: coating an N-type metal oxide semiconductor precursor solution on the first gate dielectric layer to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer.

10. The manufacturing method for OLED display panel as claimed in claim 9, wherein the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution.

11. A manufacturing method for complementary thin film transistor (TFT) device, comprising the steps of:

Step 1: providing a substrate, forming a first gate, a first electrode and a second electrode on the substrate, distributed with gaps in-between;

Step 2: forming, in subsequent order, a stack of a second active layer, a second gate dielectric layer, and a second gate at a gap area between the first electrode and the second electrode, and a portion of the gap area near the first electrode and the second electrode;

Step 3: covering the substrate, the first gate, the first electrode, the second electrode, the second gate with a first gate dielectric layer, patternizing the first gate dielectric layer to form a via above the first electrode to expose a portion of the first electrode;

Step 4: forming a first active layer on the first gate dielectric layer above the first gate;

Step 5: forming a third electrode and a fourth electrode contacting respectively with two ends of the first active layer on the first gate dielectric layer, the fourth electrode contacting the first electrode through the via;

wherein one of the first active layer and the second active layer being an N-type channel active layer and the other being a P-type channel active layer; one of the first active layer and the second active layer being a metal oxide semiconductor active layer and the other being an organic semiconductor active layer;

manufacturing process for the metal oxide semiconductor active layer comprising: disposing a metal oxide semiconductor precursor solution in an area to be formed to form a metal oxide semiconductor precursor thin film, annealing the metal oxide semiconductor precursor thin film to form a metal oxide semiconductor thin film, patternizing the metal oxide semiconductor thin film to form a metal oxide semiconductor active layer;

manufacturing process for the organic semiconductor active layer comprising: disposing an organic semiconductor solution, baking the organic semiconductor solution to obtain an organic semiconductor thin film, and patternizing the organic semiconductor film to obtain an organic semiconductor active layer;

wherein the first active layer being an N-type channel metal oxide semiconductor active layer, and the second active layer being a P-type channel organic semiconductor active layer;

wherein Step 2 specifically comprising: using a solution coating process and a baking process sequentially to obtain a P-type organic semiconductor thin film covering the substrate, the first gate, the first electrode, and the second electrode, and an organic dielectric material thin film on the P-type organic semiconductor thin film; using a vapor deposition process or a sputtering process on the organic dielectric material thin film to form a metal thin film covering the organic dielectric material thin film, patternizing the metal thin film to obtain the second gate, using the second gate as a mask to perform dry etching simultaneously on the P-type organic semiconductor thin film and the organic dielectric material thin film to obtain the second active layer and the second gate dielectric layer;

wherein Step 4 specifically comprising: coating an N-type metal oxide semiconductor precursor solution on the first gate dielectric layer to form an N-type metal oxide semiconductor precursor thin film, annealing the N-type metal oxide semiconductor precursor thin film to obtain an N-type metal oxide semiconductor thin film, patternizing the N-type metal oxide semiconductor thin film to obtain the first active layer.

12. The manufacturing method for complementary TFT device as claimed in claim 11, wherein the N-type metal oxide semiconductor precursor solution is a metal halide solution dissolved in a nitrile solvent; and he glycol solvent is used to control thickness uniformity of the N-type metal oxidation semiconductor precursor thin film when coating the N-type metal oxide semiconductor precursor solution.

\* \* \* \* \*